(12) United States Patent
Hahn, III et al.

(10) Patent No.: US 9,954,632 B2
(45) Date of Patent: Apr. 24, 2018

(54) TDMA RATE RECONFIGURABLE MATRIX POWER AMPLIFIER AND METHOD OF COMMUNICATION IN A FDMA/TDMA ARCHITECTURE

(71) Applicant: THE BOEING COMPANY, Chicago, IL (US)

(72) Inventors: Carl J. Hahn, III, Inglewood, CA (US); Daniel S. Roukos, Hermosa Beach, CA (US)

(73) Assignee: The Boeing Company, Chicago, IL (US)

( * ) Notice: Subject to any disclaimer, the term of this patent is extended or adjusted under 35 U.S.C. 154(b) by 210 days.

(21) Appl. No.: 14/844,077

(22) Filed: Sep. 3, 2015

(65) Prior Publication Data

US 2017/0070308 A1  Mar. 9, 2017

(51) Int. Cl.
  *H04J 3/16* (2006.01)
  *H03F 1/02* (2006.01)
  (Continued)

(52) U.S. Cl.
  CPC .............. *H04J 3/1694* (2013.01); *H03F 1/02* (2013.01); *H03F 3/211* (2013.01); *H03F 3/24* (2013.01);
  (Continued)

(58) Field of Classification Search
  None
  See application file for complete search history.

(56) References Cited

U.S. PATENT DOCUMENTS

| | | | |
|---|---|---|---|
| 4,931,802 A | 6/1990 | Assal et al. | |
| 7,088,173 B1 * | 8/2006 | Rozario | H03F 1/02 330/124 R |

(Continued)

FOREIGN PATENT DOCUMENTS

| | | |
|---|---|---|
| EP | 0877444 | 11/1998 |
| WO | 0143229 | 6/2001 |

OTHER PUBLICATIONS

"Winds (Wideband InterNetworking engineering test and Demonstration Satellite) / Kizuna"; https://directory.eoportal.org/web/eoportal/satellite-missions/v-w-x-y-z/winds ; ESA 2000-2015, 19 pages.

(Continued)

*Primary Examiner* — Christine Duong
(74) *Attorney, Agent, or Firm* — Perman & Green, LLP

(57) ABSTRACT

A communication system including a communication platform, and a downlink communication module connected to the communication platform and having a matrix power amplifier, the matrix power amplifier including an input hybrid matrix, an output hybrid matrix, a bank of high power amplifiers disposed between and in communication with at least the input hybrid matrix and the output hybrid matrix, and a bank of adjusters disposed between and in communication with at least the input hybrid matrix and the output hybrid matrix. The communication system further includes a driver circuit connected to each adjuster in the bank of adjusters, the driver circuit being configured to command each adjuster to modify communication signals, passing through the matrix power amplifier, at time division multiple access rates.

20 Claims, 13 Drawing Sheets

(51) Int. Cl.
　　　*H03F 3/21*　　　(2006.01)
　　　*H03F 3/24*　　　(2006.01)
　　　*H03F 3/60*　　　(2006.01)
　　　*H04B 7/06*　　　(2006.01)
　　　*H04B 7/204*　　(2006.01)
　　　*H04B 1/04*　　　(2006.01)
(52) U.S. Cl.
　　　CPC ........... *H03F 3/602* (2013.01); *H04B 7/0617* (2013.01); *H04B 7/2041* (2013.01); *H04B 7/2045* (2013.01); *H03F 2200/192* (2013.01); *H03F 2200/204* (2013.01); *H03F 2200/451* (2013.01); *H03F 2203/21142* (2013.01); *H04B 2001/0408* (2013.01)

(56) References Cited

U.S. PATENT DOCUMENTS

| 7,542,716 | B2 | 6/2009 | Bell et al. | |
|---|---|---|---|---|
| 2009/0108930 | A1* | 4/2009 | Gandhi | H03F 3/602 330/124 R |
| 2012/0163428 | A1* | 6/2012 | Shin | H03F 3/602 375/219 |
| 2014/0092804 | A1 | 4/2014 | Scott | |

OTHER PUBLICATIONS

European Search Report, European Application No. 16184281, dated Jan. 20, 2017.

* cited by examiner

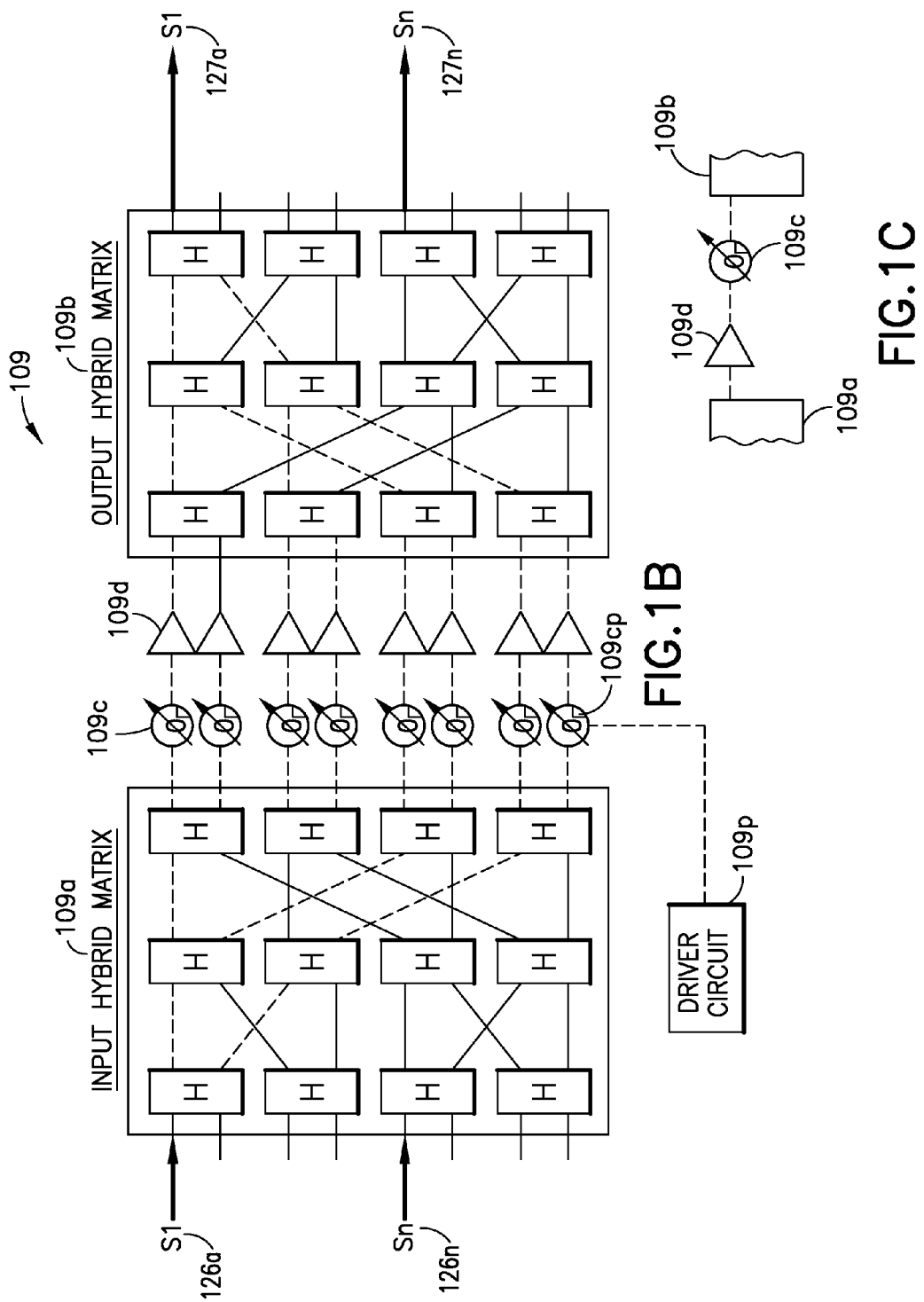

TDMA RATE RECONFIGURABLE MATRIX POWER AMPLIFIER AND METHOD OF COMMUNICATION IN A FDMA/TDMA ARCHITECTURE

BACKGROUND

Generally, in the field of telecommunications, communication transmissions are facilitated by the use of communication platforms (e.g. relay stations). These communication platforms include any vehicle, manned or unmanned, that passes over, or hovers over a territorial coverage region, ranging from typical altitudes of manned and unmanned aircraft (UAVs) and lighter than air (LTA) platforms, to communication satellites in any orbit, not just of the Earth but of any celestial object such as the Moon or Mars. Typically, communication platforms function on the bent-pipe principle, where the communication platform receives signals from the ground via receive antenna beams and return signals back to Earth via transmit antenna beams with only amplification and a shift from the uplink or downlink frequency. However, as the world begins to increasingly demand greater bandwidth and greater throughput due to the advancement of internet traffic, e-commerce, computers and other digital technologies, the existing architectures are increasingly more impractical or expensive. For example, existing examples of high throughput multi-beam communication platforms operating exclusively in frequency division multiple access (FDMA) are commonplace, but the demands made on the architectures are increasingly stretching the cost and practicality of the architecture. In the case of high throughput multi-beam communication platforms operating exclusively in FDMA, the architecture requires a large number of antenna beams to provide the frequency reuse required to maximize total throughput. The architecture also has large numbers of high power amplifiers, complex high power switch networks and complex filter networks that are often waveguide-based and large in mass and size. All of these factors contribute to high power, volume and mass demands, where power, volume and mass are limited on a spacecraft. Conventional FDMA architecture also produces high heat demands due to, for example, complex thermal dissipation systems for high power components.

Other examples of conventional communication platform architectures that may include multiport amplifier systems include regenerative repeaters operating in asynchronous transfer mode (ATM) with an ATM Switch for switching, routing, and multiplexing. However, these communication architectures typically require RF signals to be demodulated and remodulated, creating a bandwidth throughput bottleneck. Because of the bottlenecks, these communication architectures are suitable for low data rate performance and are not well suited for broadband architectures. These ATM systems also include fixed routing through the ATM switch and the burden of routing the RF signals from the reception antenna beam to the broadcast antenna beam is placed on the communication architecture itself, which is highly inefficient and increases complexity and power usage of the satellite. These ATM systems also often use fixed dwell times (e.g. fixed time division multiple access (TDMA) time frames for each antenna beam) limiting the overall bandwidth available to the system.

In beam hopping platform switch time division multiple access (PS-TDMA) systems, RF signals are routed to individual beams sequentially in time rather than simultaneously at different frequencies as in FDMA systems where beam hopping is through switching between fixed feed reflector antennas, defocused array fed reflectors, or by reconfiguring direct radiating phased arrays. The total traffic capacity of the antenna beam is dependent on the dwell time in addition to or instead of the fraction of frequency bandwidth allocated in the beam. Beam hopping PS-filter networks typically used in FDMA systems. However, Beam Hopping PS-TDMA architectures still face challenges in providing a cost-effective way for routing high RF power to antenna beams only for the time period of TDMA dwell time. Conventional beam hopping PS-TDMA architectures are implemented with high power amplifiers dedicated to single antenna beams, which present a significant burden on communication platform power supplies. The high power amplifiers used in conventional beam hopping PS-TDMA architectures further exacerbate power use concerns as the power supplies for high power amplifiers cannot switch on and off at the switching rates of typical TDMA frames and, consequently, must remain on even when no RF signal is present. In conventional beam hopping PS-TDMA architectures where high power amplifiers can be switched between antenna beams, the high power switch networks that are coupled to the high power amplifiers increase mass, occupy volume and must address high RF power considerations such as thermal dissipation, hot switching, ohmic loss and multipaction.

SUMMARY

Accordingly, a system and method, intended to address the above-identified concerns, would find utility.

One example of the present disclosure relates to a communication system comprising: a communication platform; a downlink communication module connected to the communication platform and having a matrix power amplifier, the matrix power amplifier including an input hybrid matrix, an output hybrid matrix, a bank of high power amplifiers disposed between and in communication with at least the input hybrid matrix and the output hybrid matrix, and a bank of adjusters disposed between and in communication with at least the input hybrid matrix and the output hybrid matrix; and a driver circuit connected to each adjuster in the bank of adjusters, the driver circuit being configured to command each adjuster to modify communication signals, passing through the matrix power amplifier, at time division multiple access rates.

One example of the present disclosure relates to a matrix power amplifier comprising: an input hybrid matrix having more than one input; an output hybrid matrix having more than one output; a bank of high power amplifiers disposed between and in communication with at least the input hybrid matrix and the output hybrid matrix; a bank of adjusters disposed between and in communication with at least the input hybrid matrix and the output hybrid matrix; and a driver circuit connected to each adjuster in the bank of adjusters, the driver circuit being configured to command each adjuster to modify communication signals, passing through the matrix power amplifier, at time division multiple access rates.

One example of the present disclosure relates to a method of communication comprising: inputting a communication signal to an input hybrid matrix of a matrix power amplifier; and selectively re-routing the communication signal to a predetermined output of an output hybrid matrix of the matrix power amplifier by modifying the communication signal at time division multiple access rates.

BRIEF DESCRIPTION OF THE DRAWINGS

Figure 1:
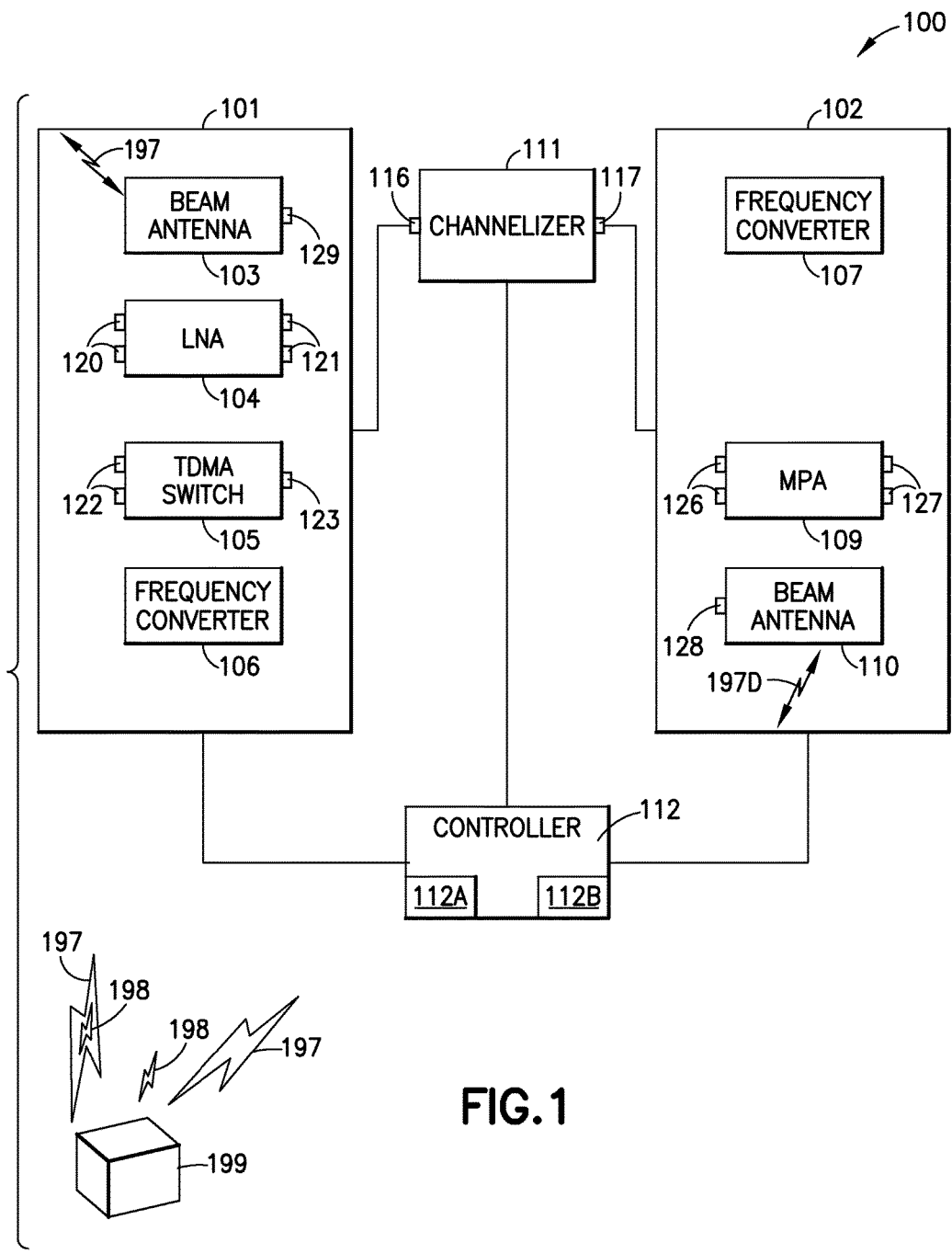
Figure 1A:
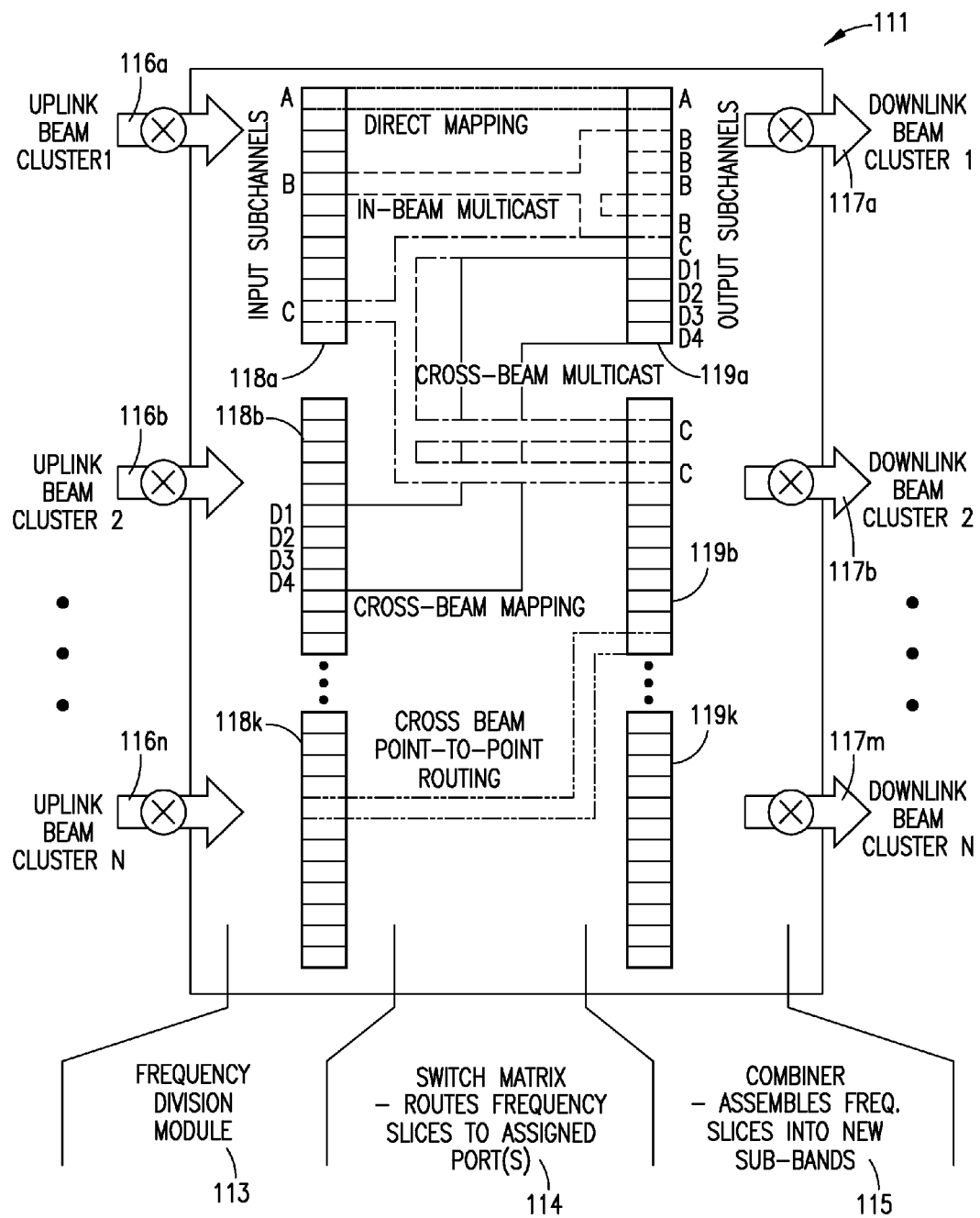
Figure 2:
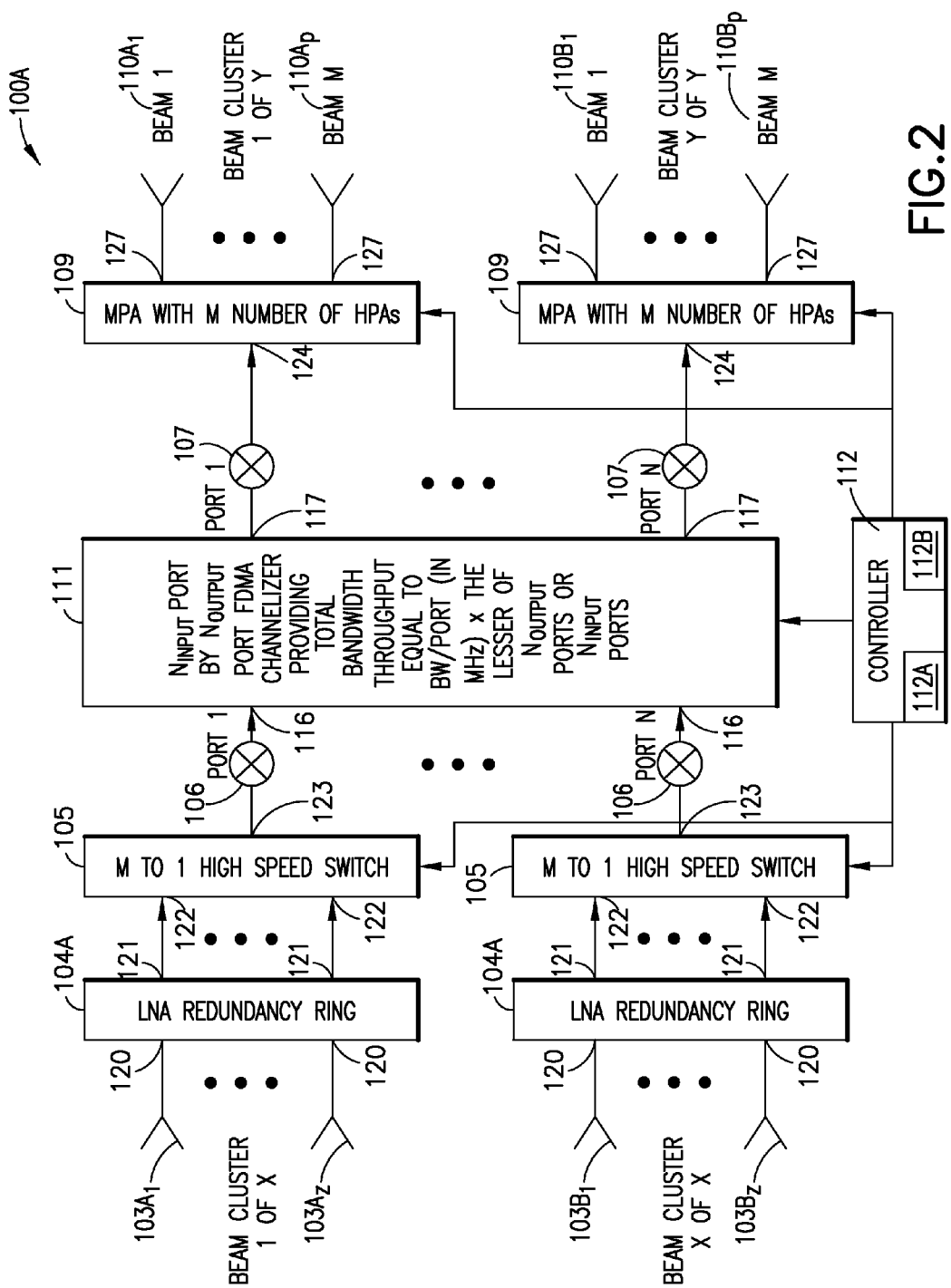
Figure 2A:
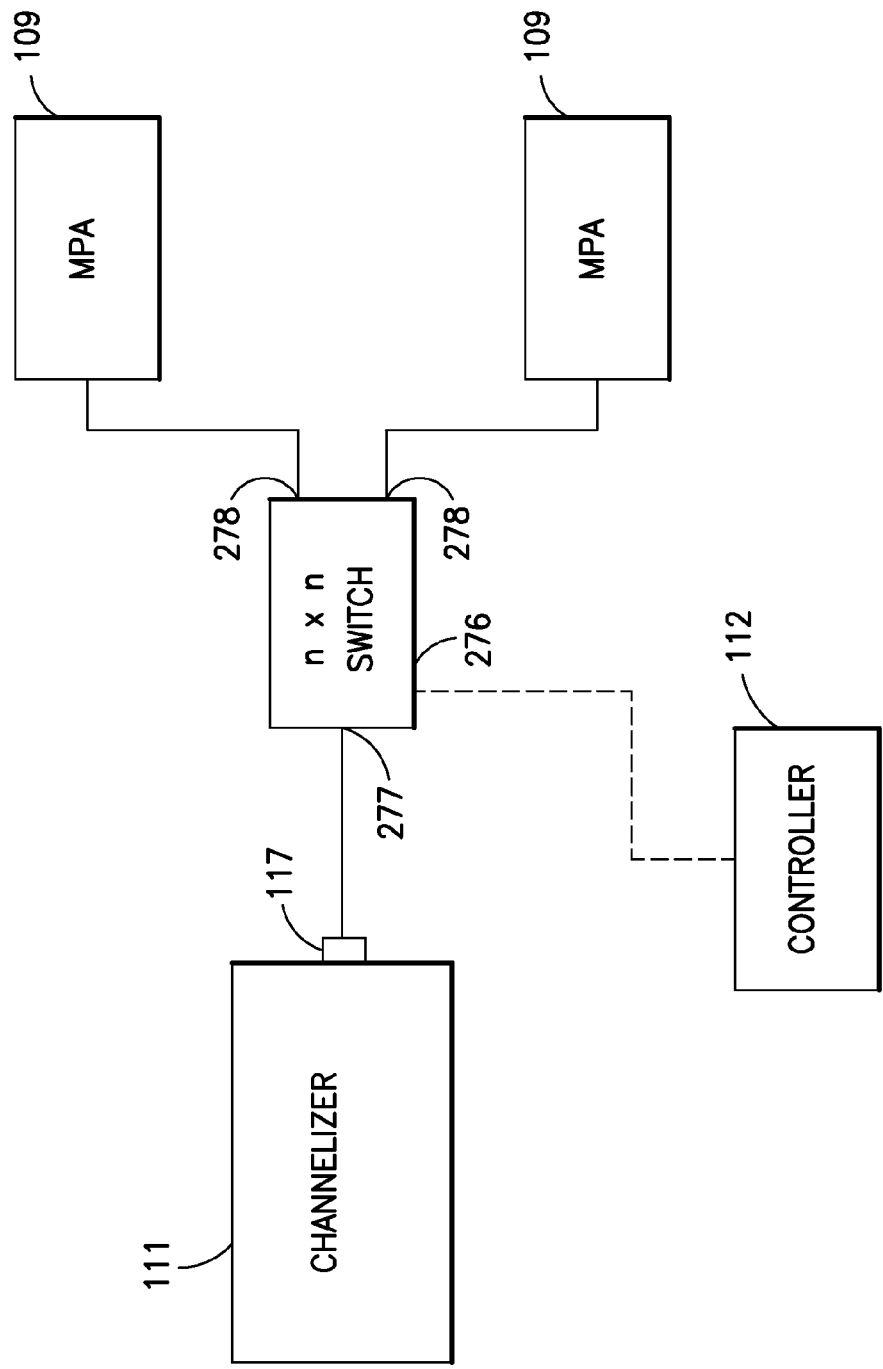
Figure 3:
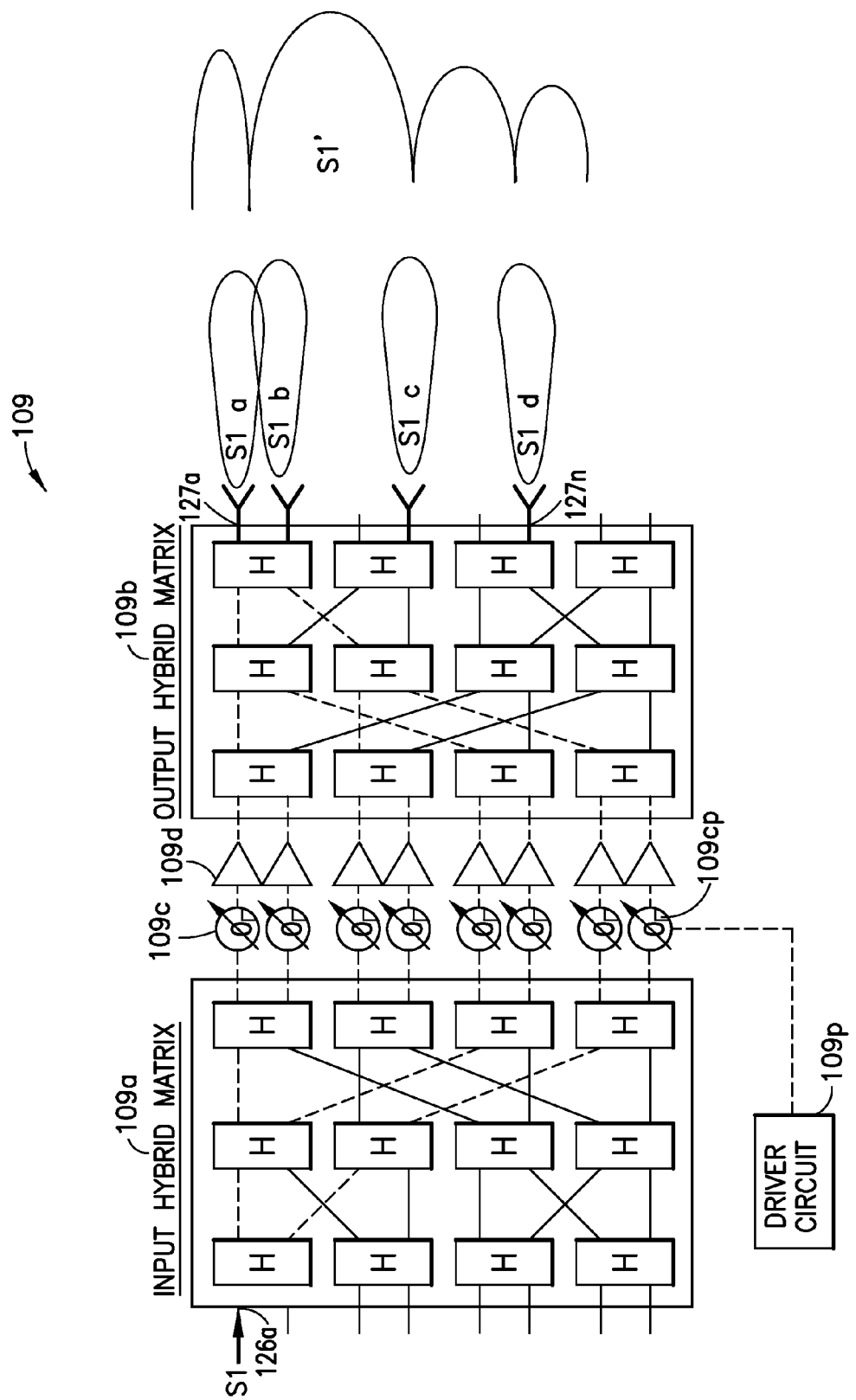
Figure 4:
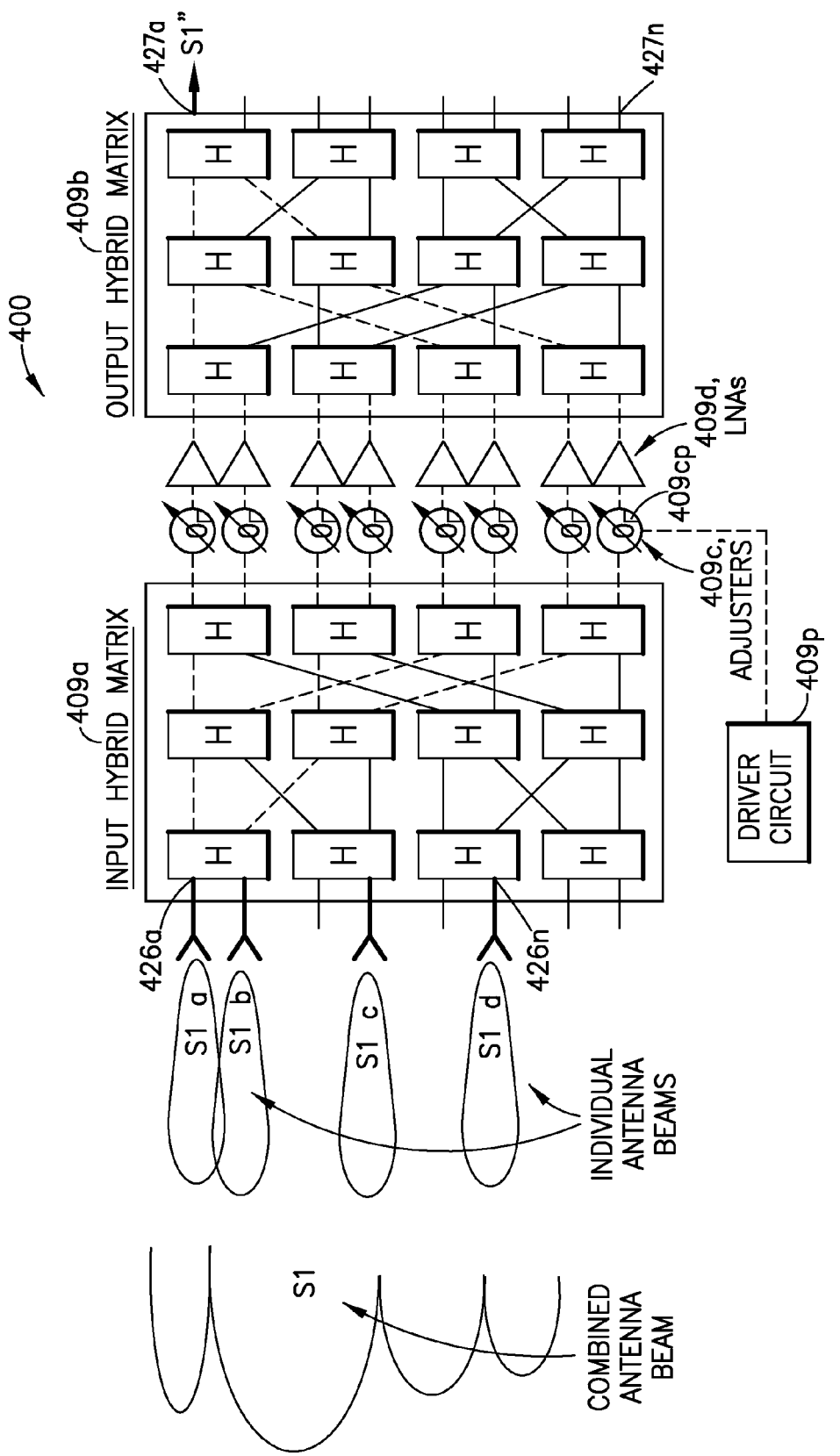
Figure 5:
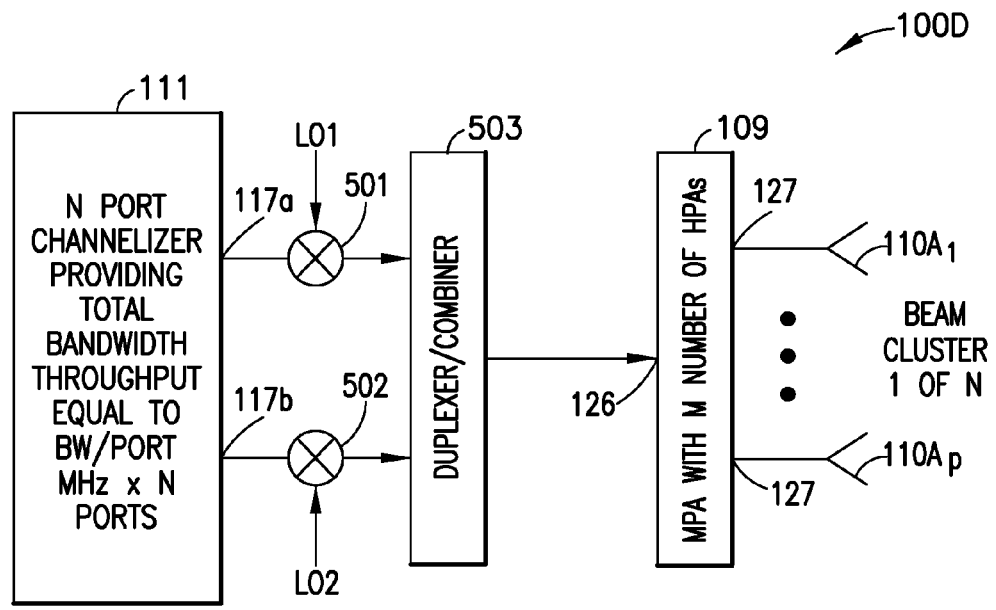
Figure 5A:
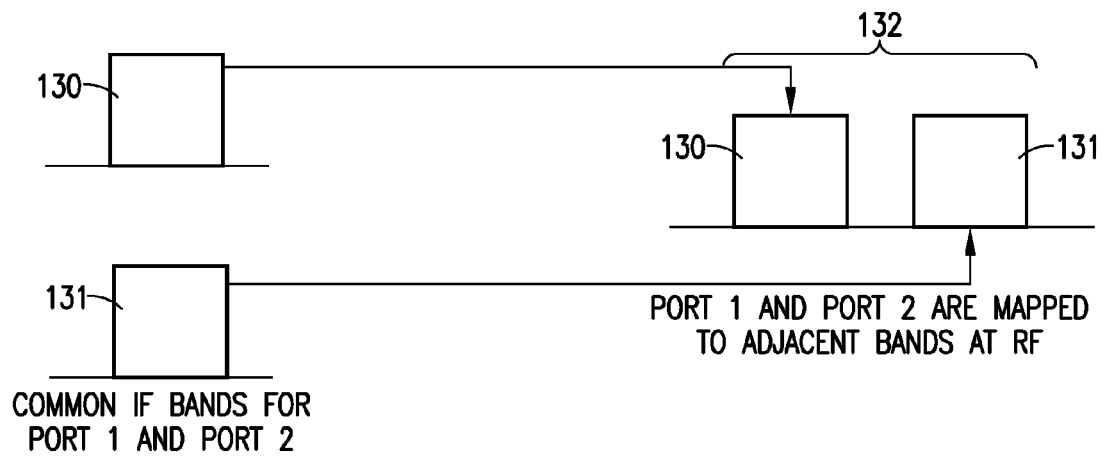
Figure 6:
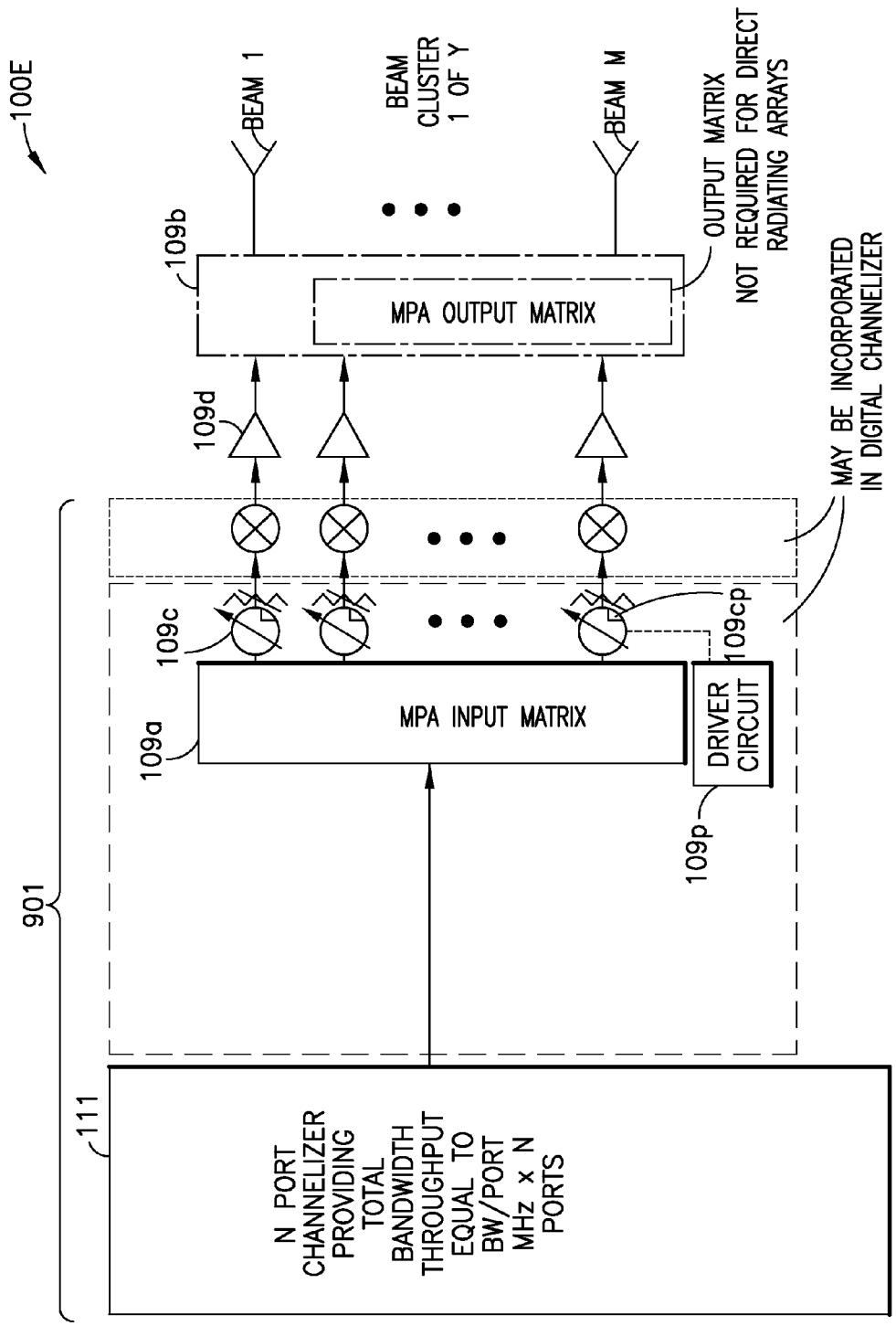
Figure 6A:
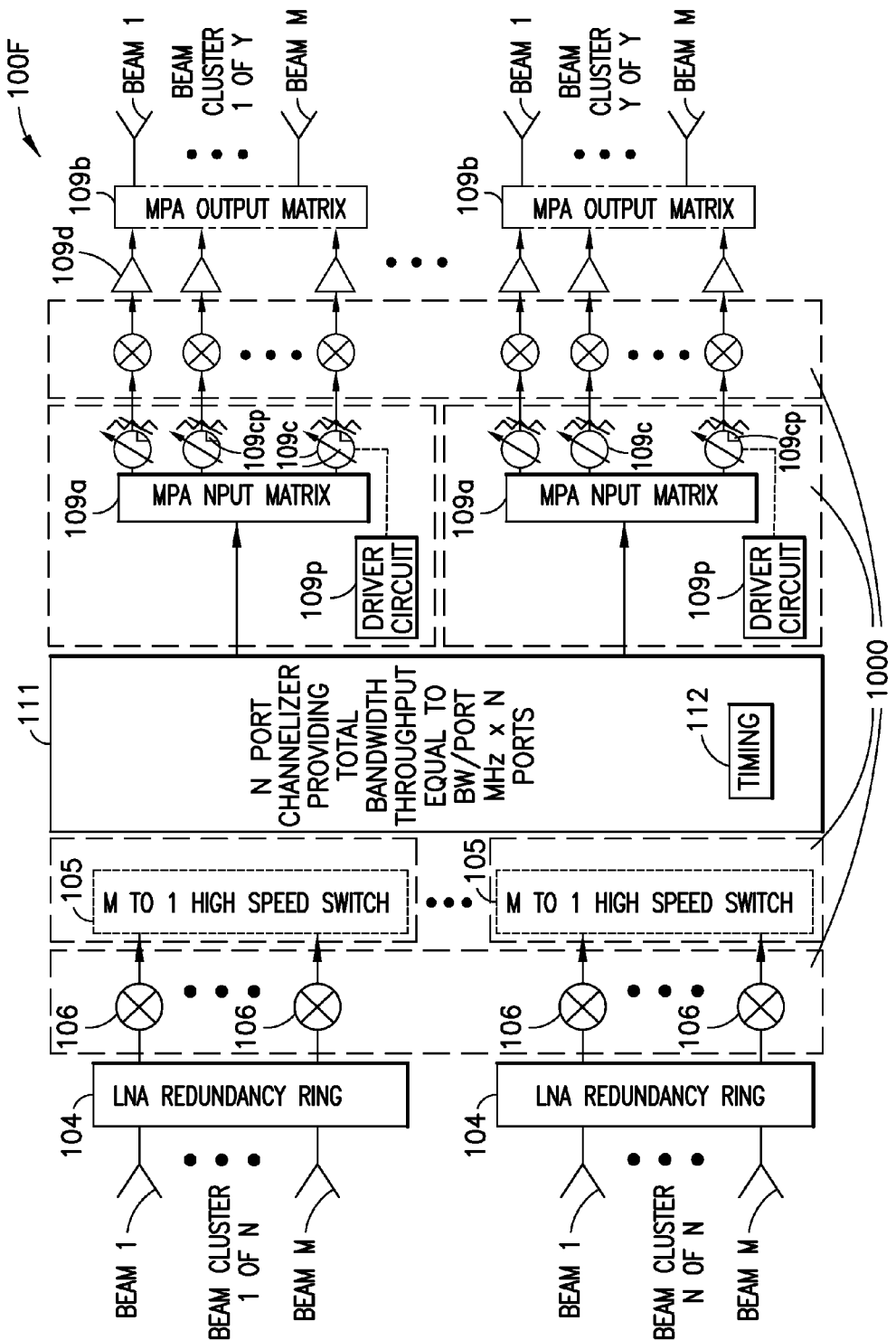
Figure 7:
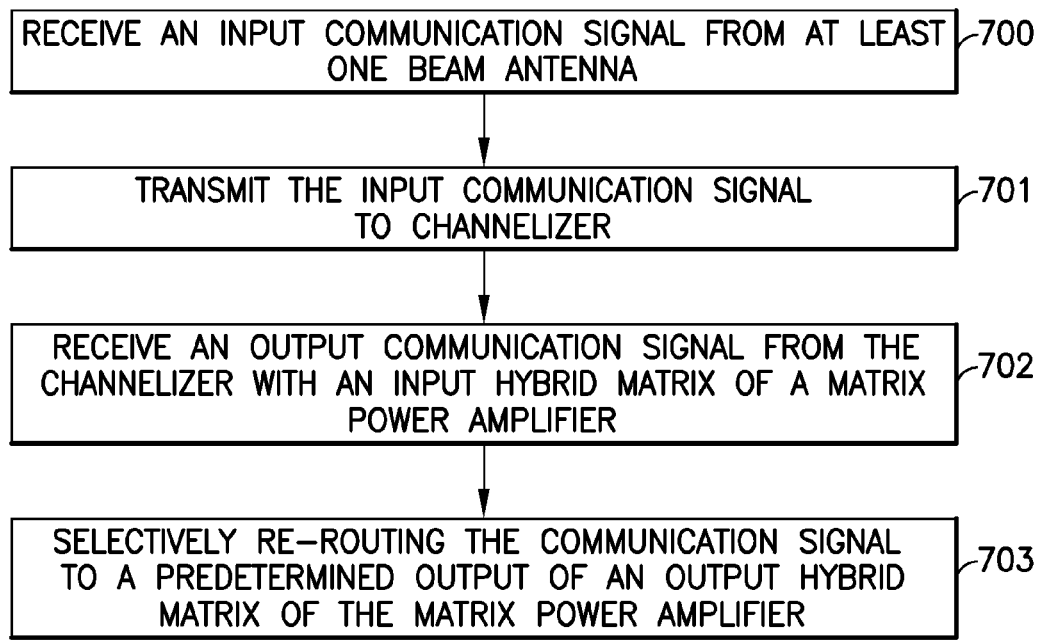
Figure 8:
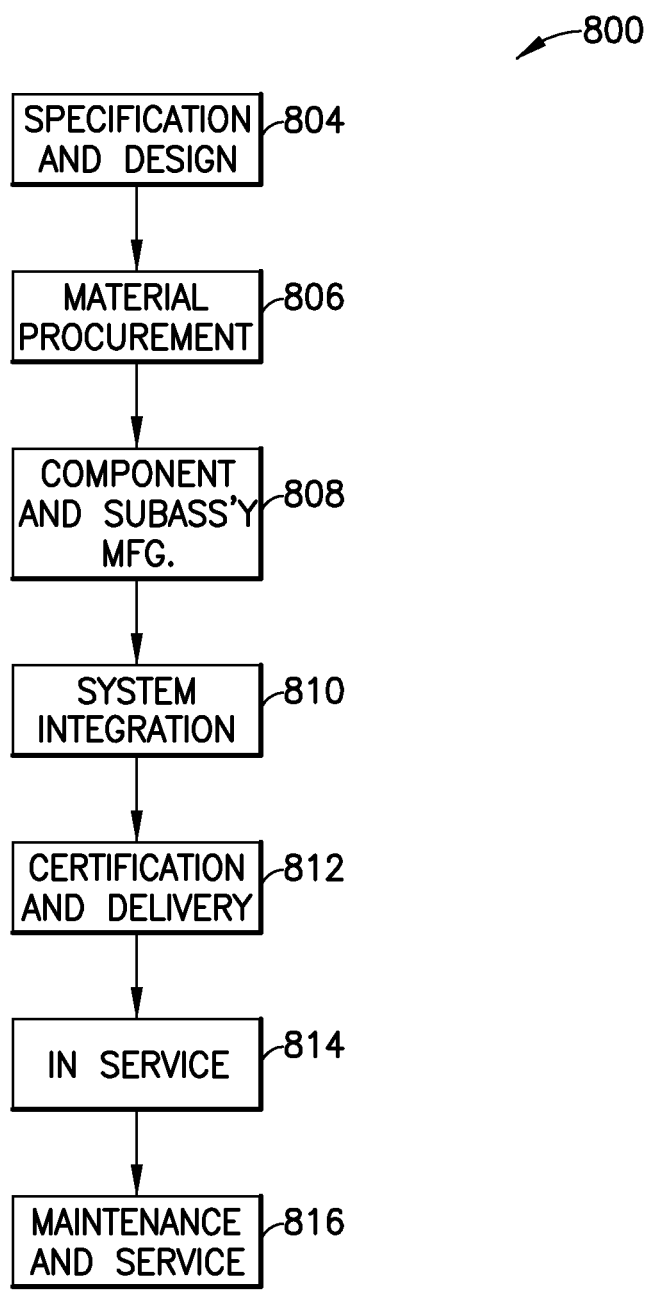
Figure 9:
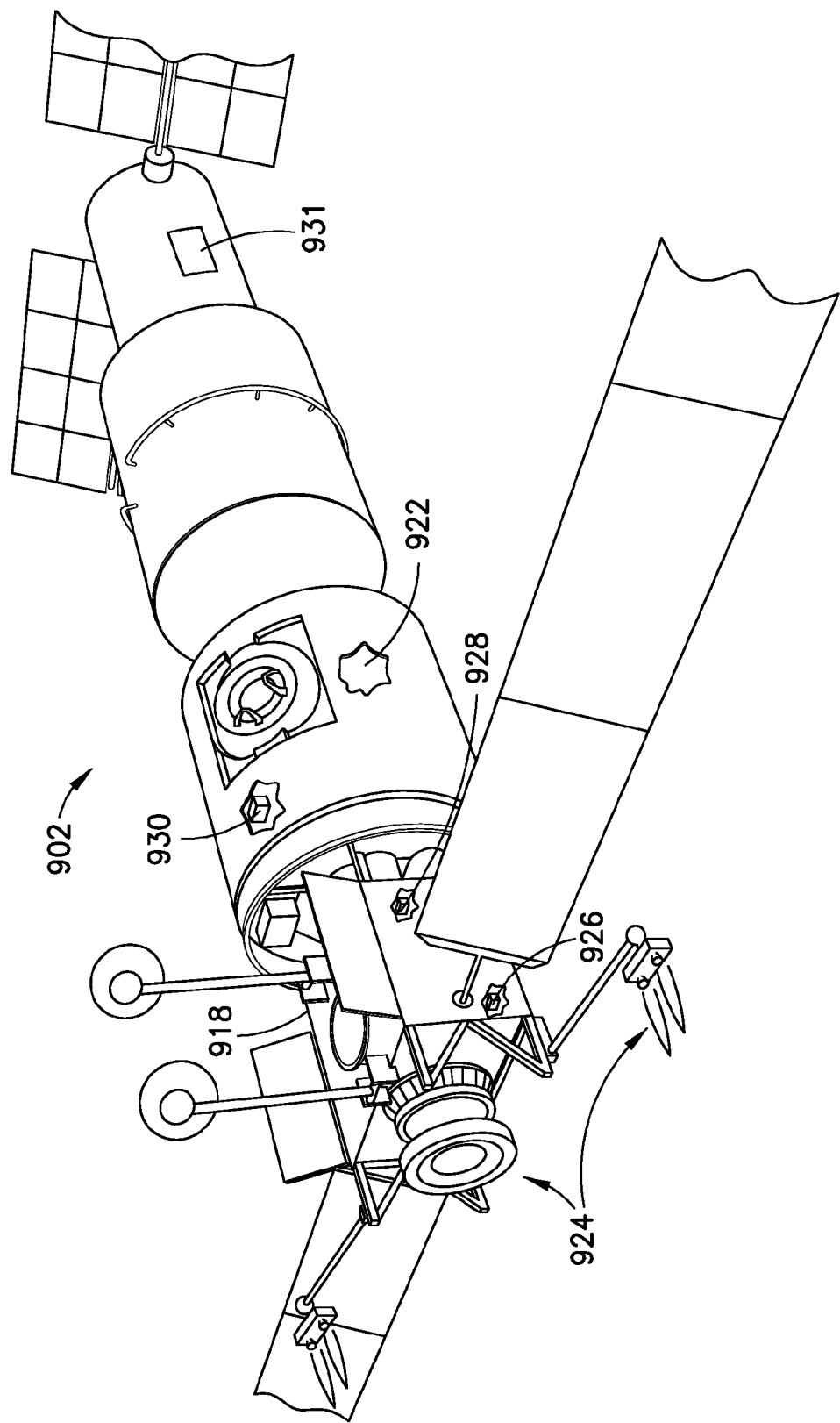

Having thus described examples of the disclosure in general terms, reference will now be made to the accompanying drawings, which are not necessarily drawn to scale, and wherein like reference characters designate the same or similar parts throughout the several views, and wherein:

FIG. 1 is a block diagram of a communications system according to one aspect of the present disclosure;

FIG. 1A is a schematic illustration of a channelizer of the communications system according to one aspect of the present disclosure;

FIG. 1B is a schematic illustration of a matrix power amplifier of the communications system according to one aspect of the present disclosure;

FIG. 1C is a schematic illustration of a portion of a matrix power amplifier of the communications system according to one aspect of the present disclosure;

FIG. 2 is a schematic illustration of the communications system according to one aspect of the present disclosure;

FIG. 2A is a schematic illustration of a portion of a communications system according to one aspect of the present disclosure;

FIG. 3 is a schematic illustration of a portion of a communications system according to one aspect of the present disclosure;

FIG. 4 is a schematic illustration of a portion of a communications system according to one aspect of the present disclosure;

FIGS. 5 and 5A are schematic illustrations of portions of the communications system according to one aspect of the present disclosure;

FIGS. 6 and 6A are schematic illustrations of portions of the communications system according to one aspect of the present disclosure;

FIG. 7 is a flow diagram of an operation of the communications system according to one aspect of the present disclosure;

FIG. 8 is a flow diagram of spacecraft production and service methodology according to one aspect of the present disclosure; and FIG. 9 is a schematic illustration of a spacecraft including distributed vehicle systems according to one aspect of the present disclosure.

In the block diagram(s) referred to above, solid lines, if any, connecting various elements and/or components may represent mechanical, electrical, fluid, optical, electromagnetic and other couplings and/or combinations thereof. As used herein, "coupled" means associated directly as well as indirectly. For example, a member A may be directly associated with a member B, or may be indirectly associated therewith, e.g., via another member C. Couplings other than those depicted in the block diagrams may also exist. Dashed lines, if any, connecting the various elements and/or components represent couplings similar in function and purpose to those represented by solid lines; however, couplings represented by the dashed lines may either be selectively provided or may relate to alternative or optional aspects of the disclosure. Likewise, elements and/or components, if any, represented with dashed lines, indicate alternative or optional aspects of the disclosure. Environmental elements, if any, are represented with dotted lines.

In the block diagram(s) referred to above, the blocks may also represent operations and/or portions thereof. Lines connecting the various blocks do not imply any particular order or dependency of the operations or portions thereof.

DETAILED DESCRIPTION

In the following description, numerous specific details are set forth to provide a thorough understanding of the disclosed concepts, which may be practiced without some or all of these particulars. In other instances, details of known devices and/or processes have been omitted to avoid unnecessarily obscuring the disclosure. While some concepts will be described in conjunction with specific examples, it will be understood that these examples are not intended to be limiting.

Reference herein to "one example" or "one aspect" means that one or more feature, structure, or characteristic described in connection with the example or aspect is included in at least one implementation. The phrase "one example" or "one aspect" in various places in the specification may or may not be referring to the same example or aspect.

Unless otherwise indicated, the terms "first," "second," "third," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Referring to FIG. 1, the aspects of the present disclosure described herein provide for a satellite communications system 100 having a combined FDMA/TDMA beam hopping communication architecture that incorporates at least one high speed TDMA rate reconfigurable matrix power amplifier 109 (see also matrix power amplifier 409 in FIG. 4) where the output 127 of the matrix power amplifier 109 is selectable. The outputs 127 of the matrix power amplifier 109 are routed to respective individual antenna beams 110 with no further switching of the communication signal. As described herein, each output 127 of the matrix power amplifier, which is connected to a respective antenna beam, is accessed from a single input 126 of the matrix power amplifier 109 by changing a phase progression angle across the amplifiers of the matrix power amplifier 109. The full bandwidth of a channelizer 111 port 117 is sent to a single beam for the duration of a TDMA frame. Aspects of the disclosed embodiment maximize the power sharing flexibility of the matrix power amplifier in the time domain rather than the frequency domain where the dwell time on each beam cluster is based on the traffic demand of that beam as a fraction of the total traffic demand of the cluster.

The aspects of the disclosed embodiment substantially eliminate complex high power switching networks that route the high power signals of a single high power amplifier to multiple beams after amplification. The aspects of the disclosed embodiment also substantially eliminate low power switch matrices such as, for example, low power TDMA microwave switch matrices that select the input of the matrix power amplifier in order to select the output beam where the high power amplifiers of, for example, the matrix power amplifier, are assigned to individual antenna beams.

While, in one aspect of the present disclosure, the communication system 100 is described as part of a satellite architecture (and is referred to herein as satellite communication system 100), it is understood that, in other aspects, the communication system 100 can be part of any aerial or orbital communications platform, for example, a long-term unmanned aerial vehicle or a lighter-than-air dirigible vehicle. The satellite communications system 100 includes an uplink receiver module 101 and a downlink transmitter module 102 which are coupled to each other through a channelizer 111. A satellite controller 112 is provided to control aspects of the operations of the satellite communication system 100 as described herein. The satellite controller 112 controls the operation of the uplink receiver module 101, the downlink transmitter module 102 and the channelizer 111 and, more specifically, the satellite controller 112 controls how an RF signal (e.g. in one aspect, a TDMA signal) or an optical signal, received by the uplink receiver module 101, is routed to the beam antennas 110 of the downlink transmitter module 102. In one aspect of the present disclosure, the satellite controller 112 includes a time synchronization module 112B and a memory 112A. In one aspect of the present disclosure, the time synchronization module 112B synchronizes communication between the uplink receiver module 101, the downlink transmitter module 102 and the channelizer 111. In one aspect, the time synchronization module 112B provides a time synchronization signal to the uplink receiver module 101, the downlink transmitter module 102 and the channelizer 111. In one aspect of the present disclosure, the time synchronization signal generated by the time synchronization module 112B is derived from a control signal 198 from a terrestrial (or other ground-based) source 199 that is received by the satellite controller 112. In one aspect of the present disclosure, the control signal 198 received from the terrestrial source 199 provides instructions to the satellite controller 112 for routing a RF communication signal 197 (e.g. a TDMA signal) from the beam antennas 103 of the uplink receiver module 101 to the beam antennas 110 of the downlink transmitter module 102 and/or for controlling the duration of dwell times of a TDMA time frame when broadcasting a communication signal 197D from the beam antennas 110. In one aspect of the present disclosure, the control signal 198 from the terrestrial source 199 is carried along with (e.g. sent substantially simultaneously) the RF communication signals 197 received by the uplink receiver module 101, while in other aspects, the control signal 198 and the RF communication signals 197 are sent sequentially, one after the other. In still other aspects, the control signal 198 is sent prior to any RF communication signals 197 being received by the satellite within a predetermined time period. For example, in one aspect, the control signal 198 is received by the satellite controller 112 in substantially real time, (e.g. the control signal 198 is received to control the routing through the satellite communication system 100 at substantially the same time as the RF communication signals 197 are received) so that the control signal 198 corresponds to a given transmission. In other aspects, the satellite controller 112 receives one or more control signals 198 in advance and stores the data provided by the control signal 198 within the satellite controller memory 112A. Here, the control signal 198 corresponds to transmissions that will be made within a predetermined time period (e.g. microseconds, minutes, hours, days, etc.) where the routing for each transmission through the satellite communication system 100 for the predetermined period is stored in the satellite controller memory 112A as, for example, a routing table or in any other format that allows the controller 112 to correlate a RF communication signal 197 with a corresponding time slot and beam antenna 110. In one aspect, the control signal 198 reconfigures the satellite controller 112 depending on the transmissions to be made.

Still referring to FIG. 1, in one aspect, the uplink receiver module 101 includes one or more beam antennas 103, one or more low noise amplifiers (LNA) 104, one or more TDMA switches 105 and one or more frequency converters 106. In one aspect of the present disclosure, the beam antennas 103 are satellite antennas for receiving the RF communication signal 197 from a signal source such as the terrestrial source 199. In one aspect of the present disclosure, beam antennas 103 are spot beam antennas, while in other aspects, the beam antennas 103 are multi-beam feeds or phased array antennas. In one aspect, the beam antennas 103 are an input source for the satellite communication system 100. In one aspect of the present disclosure, the RF communications signals 197 received by the beam antennas 103 are TDMA signals while in other aspects the communication signals received by the antennas are optical signals. In one aspect of the present disclosure, the TDMA signals received by the beam antennas 103 are transmitted to the one or more low noise amplifiers 104 via a beam antenna output 129. The low noise amplifiers 104 receive the TDMA signal through a LNA input 120 and, in turn, amplify the TDMA signals. In one aspect of the present disclosure, there is one low noise amplifier 104 for each beam antenna 103. However, in other aspects, one or more low noise amplifiers 104 are shared between multiple beam antennas 103. In one aspect of the present disclosure, there are multiple low noise amplifiers 104 for each uplink beam antenna 103 arranged in a redundancy ring configuration.

The uplink receiver module 101 further includes one or more TDMA switches 105. In one aspect of the present disclosure, the TDMA switches 105 have one switch output 123 and more than one switch input 122 for receiving a TDMA signal (e.g. from the low noise amplifier 104). In one aspect of the disclosed embodiment, the switch inputs 122 receive the TDMA signal from at least one input source comprising a plurality of input beams (e.g. beam antennas 103). In one aspect of the present disclosure, the TDMA switches 105 are high speed and low power TDMA switches for low power radio frequency applications of about 0 dBm or less. In other aspects, the TDMA switches 105 are, for example, high speed and high power TDMA switches. In one aspect, one or more frequency converters 106 are disposed between the low noise amplifier 104 and the channelizer 111 as described herein. In one aspect of the present disclosure, the one or more frequency converters 106 are local oscillators, but in other aspects, the one or more frequency converters 106 are any mechanism for shifting the frequency of a TDMA signal. In another aspect of the present disclosure, the TDMA switch 105 is permanently connected to a single path of the TDMA signal for the duration of a TDMA time frame so that, in effect, that the uplink receiver module 101 does not have a TDMA switch 105. In other aspects, the TMDA switch 105 is omitted as part of the uplink receiver module 101. In one aspect, the low noise amplifiers 104 and TDMA switches 105 are replaced with a matrix power amplifier 400 (FIG. 4) as will be described herein.

Referring still to FIG. 1, the uplink receiver module 101 is connected to a FDMA channelizer 111 (generally referred to as the channelizer 111). In one aspect of the present disclosure, each TDMA switch 105 (or each output of the matrix power amplifier 400) is connected to a respective channelizer input 116 of the channelizer 111, where the channelizer 111 receives a TDMA signal from each TDMA switch 105 (or each output of the matrix power amplifier 400). In other aspects, the channelizer 111 can have any predetermined number of channelizer inputs 116. In one aspect of the present disclosure, the channelizer 111 provides fixed or dynamic rerouting of the TDMA signal received from the TDMA switches 105 (or the outputs of the matrix power amplifier 400) according, for example, to the time synchronization signal from the time synchronization module 112B of the satellite controller 112.

Referring to FIG. 1, in one aspect, the channelizer 111 is configured to provide frequency division multiplexing for the TDMA signal received by the channelizer 111 from the TDMA switch 105 (or matrix power amplifier 400). In one aspect of the present disclosure, frequency division multiplexing of the TDMA signal means that the channelizer 111 breaks the TDMA signal, received by the channelizer 111, to different frequency bands (e.g. input subchannels 118a-118k, FIG. 1A). The channelizer 111 is configured to reassemble the frequency bands (e.g. output subchannels 119a-119k, FIG. 1A) based on the routing of the frequency bands to a predetermined downlink beam antenna 110 of the downlink transmitter module 102.

Referring now to FIGS. 1 and 1A, an exemplary diagram of a channelizer 111 is shown. In one aspect the channelizer 111 includes pre-designated bent pipe routes and/or demodulation/remodulation features that allow high speed circuit switching, packet switching and asynchronous transfer mode switching. In another aspect, the channelizer is an optical channelizer so that, where the communication signals are optical signals, the signals travel through the channelizer at light wave frequencies/wavelengths. In one aspect, the channelizer 111 includes N channelizer inputs 116a-116n and M channelizer outputs 117a-117m, where N and M are predetermined numbers greater than one. In one aspect, the inputs 116a-116n and outputs 117a-117m of the channelizer are a combination of TDMA and FDMA ports while in other aspects the input and output ports are TDMA or FDMA. Each of the channelizer inputs 116a-116n is connected to a respective switch output 123 of the TDMA switches 105 (or a respective output of the matrix power amplifier 400) and receives the TDMA signal from the respective TDMA switch 105 (or the respective output of the matrix power amplifier 400). In one aspect, the channelizer 111 provides connectivity between the N channelizer inputs 116a-116n to each of the M channelizer outputs 117a-117m for K input and K output subchannels for each of the N channelizer inputs 116a-116n and the M channelizer outputs 117a-117m, where K is a predetermined number greater than one. In this aspect, the number of input subchannels 118a-118k and output subchannels 119a-119k are the same, but in other aspects, the number of input subchannels 118a-118k is different than the number of output subchannels 119a-119k. In one aspect, each of the channelizer inputs 116a-116n and each of the channelizer outputs 117a-117m have a predetermined bandwidth BW. In one aspect, the channelizer 111 includes a frequency division module 113, a switch matrix 114 and a combiner module 115. The frequency division module 113 divides the input sub-band spectrum of the TDMA signal(s) from each input 116a-116n into frequency slices and provides the frequency slices to the K input subchannels 118a-118k. The switch matrix 114 routes the frequency slices from the input subchannels 118a-118k to a predetermined one of K output subchannels 119a-119k. In one aspect of the present disclosure, the frequency slices from the input subchannels 118a-118k are sent to one of the output subchannels 119a-119k or broadcast to any of the channelizer outputs 117a-117m substantially simultaneously. As noted above, in one aspect, the routing is fixed in that the routing of the frequency slices remain the same depending on, for example, input. However, in other aspects, the routing of the frequency slices is configurable depending on, for example, the control signal 198 from the satellite controller 112, which, in one aspect, includes instructions for routing the frequency slices from the input subchannels 118a-118k to the output subchannels 119a-119k The combiner module 115 concatenates (or multiplexes) the frequency slices into appropriate output sub-bands (which, in one aspect, are different from the input sub-bands) and routes the output sub-bands to the respective output subchannels 119a-119k. In one aspect, connectivity between the channelizer inputs 116a-116n and the channelizer outputs 117a-117m is on the basis of subchannels that are less than or equal to the channelizer Bandwidth (BW) which, in one aspect, has units of megahertz (MHz). In one aspect, each channelizer input 116a-116n of the channelizer 111 divides the bandwidth of the channelizer input 116a-116n into K input subchannels 118a-118k. In one aspect, each of the K input subchannels 118a-118k can be sent to one of the M channelizer outputs 117a-117m or broadcast to any number of channelizer outputs 117a-117m substantially simultaneously. In one aspect, the K input subchannels 118a-118k can be concatenated to form contiguous channels of any number of K output subchannels 119a-119k. The output subchannels 119a-119k correspond to respective channelizer outputs 117a-117m of the channelizer 111, where the signal output from the channelizer output 117a-117m are provided to beam antennas 110 of the downlink transmitter module 102. In one aspect, each of the channelizer outputs 117a-117m combine the K subchannels into the bandwidth of the port. In one aspect, the channelizer 111 has a capacity equal to the total throughput bandwidth (N×BW, where N and M are the same) multiplied by the number of bits per hertz given by a waveform choice and link capacity. In one aspect, a TDMA architecture allows the full bandwidth of the output ports 117a-117m to be sent to a single beam antenna 110 for the duration of a TDMA time frame with little interference from adjacent beams or intermodulation distortion, thus maximizing the channel capacity for a given bandwidth and radiated power. In one aspect, the channelizer 111 has a "mesh," "star," or mixed configuration, where any TDMA signal received by the channelizer inputs 116a-116n are routed to any channelizer output 117a-117m on a sub-channel by sub-channel basis. In one aspect, a "star" architecture is formed by assigning certain beams to gateway status and dwelling on them for longer periods of time and over wider bandwidths as necessary. In one aspect, the channelizer 111 is a digital channelizer 111, while in other aspects, the channelizer 111 is an analog channelizer. In other aspects, portions of the channelizer 111 are digital while other portions are analog. In one aspect, the channelizer 111 receives both TDMA and traditional FDMA signals as channelizer inputs 116. In one aspect, the channelizer 111 provides direct to RF band sampling and all functions, including amplification of a TDMA signal, are digitally incorporated into a digital processor.

Referring again to FIG. 1, the channelizer outputs 117a-117m transmit a resultant (e.g. an output) TDMA signal to the downlink transmitter module 102. In one aspect of the present disclosure, the downlink transmitter module 102 includes one or more digital or analog matrix power amplifiers 109 which receive a respective output TDMA signal from the channelizer outputs 117a-117m and one or more beam antennas 110 which transmit the output of the matrix power amplifiers 109. In other aspects, the downlink transmitter module 102 also includes one or more frequency converters 107, substantially similar to the frequency converters 106 of the uplink receiver module 101, arranged between the channelizer 111 and the one or more matrix power amplifiers 109. In one aspect, each matrix power amplifier 109 include phase shifters that enable a predetermined matrix power amplifier output 127 of the matrix power amplifiers 109 to be routed to a predetermined beam antenna 110 without additional switching downstream of the matrix power amplifier 109 (e.g. high power switching) or in one aspect, without additional switching, outside of the matrix power amplifier 109, downstream of the channelizer 111. In one aspect, the power sharing flexibility of the matrix power amplifier 109 is maximized in the time domain rather than the frequency domain. In one aspect, the downlink transmitter module 102 eliminates bulky high power switching networks required to route high power signals of a single high power amplifier to multiple beam antennas 110 after amplification or the need to assign high power amplifiers to each individual beam antenna 110.

As noted above, the channelizer outputs 117a-117n correspond to a selected matrix power amplifier input 126 (e.g. a predetermined input) of the matrix power amplifier 109. Referring now to FIG. 1B, an exemplary matrix power amplifier 109 is shown. In one aspect, the matrix power amplifier 109 includes an input hybrid matrix 109a (also known as an input power dividing network), an output hybrid matrix 109b that inverts the process of the input hybrid matrix 109a, a bank of trim adjusters 109c and a bank of high power amplifiers 109d. The trim adjusters 109c and high power amplifiers 109d operate in parallel and are disposed between and in communication with the input hybrid matrix 109a and output hybrid matrix 109b. In one aspect, the trim adjusters 109c are disposed between and in communication with at least the input hybrid matrix and the high power amplifiers 109d. In one aspect, there is a trim adjuster 109c located upstream from each high power amplifier 109d. In another aspect, as illustrated in FIG. 1C, there is a trim adjuster located downstream from each high power amplifier 109d. In one aspect, there is a trim adjuster 109c corresponding to each high power amplifier 109d while in other aspects, there may be more trim adjusters 109c than high power amplifiers 109d (where one high power amplifier is common to more than one trim adjuster). In still other aspects, there may be less trim adjusters 109c than high power amplifiers 109d (where one trim adjuster is common to more than one high power amplifier). In one aspect the matrix power amplifier 109 is a reconfigurable hybrid matrix power amplifier where each matrix power amplifier input 126 of the matrix power amplifier 109 is selectively mapped, e.g. commandably changed during operation, to a predetermined matrix power amplifier output 127 of the matrix power amplifier 109. In one aspect any one or more inputs 126a-126n is/are routed to any one or more outputs 127a-127n. For example, the trim adjusters 109c include commandable phase shifters 109cp that are connected to, for example, a driver circuit 109p. The driver circuit 109p is connected to the controller 112 and receives communication commands from the controller 112 regarding routing of the communication signals through the matrix power amplifier 109. The driver circuit 109p is configured to command each trim adjuster 109c to modify the communication signals, based on the communication commands, passing through the matrix power amplifier 109 at TDMA rates. The commandable phase shifters 109cp of the trim adjusters 109c, under the control of the driver circuit 109p, select the communication signal (e.g. beam) routing within the matrix power amplifier 109, e.g. re-map each input 126a-126n to a predetermined output 127a-127n, by changing the phase progression angles between the high power amplifiers 109d, which changes the output port 127a-127n to which the communication signals are routed. In one aspect, the bank of trim adjusters 109c align the responses of the bank of high power amplifiers 109d such that the signals from one or more high power amplifiers 109d combine in the output hybrid matrix 109b and sum to a single output 127a-127n of the matrix power amplifier 109. In one aspect, where only one signal is present on a single input then there exists a set of phase adjustments that will route the signal to any one or more of the outputs 127a-127n of the matrix power amplifier 109. In one aspect, the phase changes made by the trim adjusters 109c are made at TDMA rates for re-routing the communication signals through the matrix power amplifier while substantially eliminating high power switching and allowing the high power amplifiers 109d to operate substantially simultaneously at maximum efficiency for the duration of a TDMA time frame. In one aspect, at least a portion of the matrix power amplifier is digital where the phase adjustments, described herein, made to the communication signal(s) by the matrix power amplifier are implemented digitally. In other aspects, at least a portion of the matrix power amplifier is analog for implementing the phase adjustments.

In one aspect, multiple TDMA signals can be injected at multiple matrix power amplifier inputs 126 and routed to their respective matrix power amplifier outputs 127 substantially simultaneously. In one aspect, the frequency of the TDMA signal received at one of the matrix power amplifier inputs 126 is the same as the frequency of the TDMA signal received at any of the other matrix power amplifier inputs 126. However, in other aspects, the frequencies of the TDMA signal received by each of the matrix power amplifier inputs 126 are different, so long as the bandwidth of the high power amplifiers 109c and all other intervening components (for example, the trim adjuster 109c) encompass the bandwidth of the TDMA signal received by the matrix power amplifier inputs 126. In one aspect, the input hybrid matrix 109a is implemented digitally in a digital module. In one aspect, the matrix power amplifier 109 are implemented in direct radiating arrays as well as shaped aperture arrays where the function of the output hybrid matrix 109b is performed by antenna optics instead of a circuit.

Each of the respective matrix power amplifier outputs 127a-127n of the matrix power amplifier 109 is further coupled to a corresponding one of beam antennas 110. In one aspect, the beam antennas 110 are spot beam antennas. However, in other aspects, the beam antennas 110 are multi-beam feeds or phased array antennas. Each of the beam antennas 110 outputs the TDMA signal from the corresponding matrix power amplifier outputs 127a-127n of the matrix power amplifier 109 for a predetermined time. In one aspect of the present disclosure, the predetermined time is the dwell time of the TDMA signal that is controlled based on the timing synchronization signal from the time synchronization module 112B. In one aspect of the present disclosure, the TDMA signal output from the matrix power amplifier outputs 127a-127n has a predetermined frequency and amplitude based on the timing synchronization signal from the time synchronization module 112B. In one aspect, the coupling between the channelizer 111 and the matrix power amplifiers 109 provide a full bandwidth of the TDMA signal output by the channelizer 111 to the beam antenna 110 for a duration of the time division multiple access time frame (e.g. the dwell time). In one aspect, the time synchronization module 112B effects a full bandwidth of the channelizer 111 to be output to the antenna beam 110 for a duration of a time division multiple access time frame. For example, at about 3 Bits/Hz, a channelizer 111 payload with about 40 output ports using about 500 MHz per port could provide about 60

GB capacity with full frequency and capacity flexibility. In one aspect, there are equal numbers of beam clusters and beam antennas 110 within the downlink transmitter module 102 as there are beam clusters and beam antennas 103 in the uplink receiver module 101. However, in other aspects, there are different numbers of beam clusters and beam antennas 110 within the downlink transmitter module 102 from the number of beam clusters and beam antennas 103 in the uplink receiver module 101.

In one aspect of the present disclosure, one or more frequency converters 107 are disposed between the channelizer outputs 117 and the inputs 126 of the matrix power amplifier(s) 109. The frequency converters 107 are substantially similar to frequency converters 106 described herein.

Referring now to FIG. 2, an exemplary satellite communication system 100A is shown. In FIG. 2, multiple beam clusters 1-X are shown, each beam cluster 1-X corresponds to beam antennas $103A_{1-Z}$ and $103B_{1-Z}$, where Z is any predetermined number greater than 1. In one aspect, two sets of beam antennas $103A_{1-Z}$ and $103B_{1-Z}$ are shown, but in other aspects, there are any predetermined number of sets of beam antennas 103 corresponding to beam clusters 1-X. Each of the beam antennas $103A_{1-Z}$ and $103B_{1-Z}$ is coupled to the input 120 of a low noise amplifier redundancy ring 104A (as described herein). In one aspect of the present disclosure, the low noise amplifier redundancy rings 104A receive a TDMA signal from each beam antenna $103A_{1-Z}$ and $103B_{1-Z}$. In one aspect, each low noise amplifier redundancy ring 104A receives the TDMA signals from the beam antennas $103A_{1-Z}$ and $103B_{1-Z}$ associated with one of the beam clusters 1-X. For example, in one aspect, one of the low noise amplifier redundancy rings 104A receives beam antennas $103A_{1-Z}$ and $103B_{1-Z}$ associated with beam cluster 1. In other aspects, the low noise amplifier redundancy rings 104A receive a TDMA signal from beam antennas $103A_{1-Z}$ and $103B_{1-Z}$ associated with multiple beam clusters 1-X. The low noise amplifier redundancy rings 104A have LNA outputs 121 which are connected to the switch inputs 122 of the TDMA switches 105. In one aspect, one TDMA switch 105 is coupled to each low noise amplifier redundancy ring 104A. Each of the TDMA switches 105 also has a switch output 123 and switches the TDMA signal according to the timing synchronization signal from the time synchronization module 112B. In one aspect of the present disclosure, the switch outputs 123 of the TDMA switches 105 are coupled to frequency converters 106, located between the TDMA switch 105 and the channelizer 111, which are configured to change the frequency of the TDMA signal output by the TDMA switches 105. The channelizer 111 has channelizer outputs 117 connected to the frequency converters 107. The channelizer 111 outputs a resultant TDMA signal (e.g. an output TDMA signal) to the frequency converters 107 located between the channelizer 111 and matrix power amplifier 109. It is noted that each output 117 of the channelizer 111 is illustrated in FIG. 2 as being connected to a single matrix power amplifier 109. However, in other aspects, as illustrated in FIG. 2A, each output 117 of the channelizer is coupled to more than one matrix power amplifier 109 through a respective switch 276 having one or more inputs 277 and one or more outputs 278. In one aspect, there is one switch 276 for each channelizer output 117 while in other aspects the switch 276 is common to more than one channelizer output 117. In one aspect the switch 276 may be integrated into the channelizer such as through digital or analog integration. The switch is in one aspect connected to controller 112 and receives commands from the controller for directing the channelizer output signals to one or more of the matrix power amplifiers 109 connected to the respective switch 276.

The matrix power amplifier 109 outputs the TDMA signal, based on the timing synchronization signal from the time synchronization module 112B, to an output 127 of the matrix power amplifier 109 which is connected to a corresponding downlink antenna beam $110A_{1-P}$, $110B_{1-P}$. In one aspect of the present disclosure, the predetermined matrix power amplifier input 126 of the matrix power amplifier 109 is selectively mapped to a predetermined matrix power amplifier output 127 of the matrix power amplifier 109 as described herein. The predetermined matrix power amplifier output 127 of the matrix power amplifier 109 is coupled to a corresponding downlink beam antenna $110A_{1-P}$ and $110B_{1-P}$ which, in turn, transmits the output TDMA signal as TDMA signal 197D. In one aspect, two sets of beam antennas $110A_{1-P}$ and $110B_{1-P}$ are shown, but in other aspects, there is any predetermined number of sets of beam antennas 110 corresponding to beam clusters 1-Y. In one aspect, the number of beam antennas $103A_{1-Z}$, $103B_{1-Z}$ is the same as the number of beam antennas $110A_{1-P}$, $110B_{1-P}$ (e.g. P is the same as Z), but in other aspects, the number of beam antennas $103A_{1-Z}$, $103B_{1-Z}$ is different than the number of beam antennas $110A_{1-P}$, $110B_{1-P}$ (e.g. P is different from Z).

Referring now to FIG. 3, a portion of a satellite communication system, such as satellite communication system 100, 100A is illustrated. In this aspect, the matrix power amplifier 109 is controlled by the controller 112 to reshape the downlink antenna beams. For example, the phase shifters 109cp of the trim adjusters 109c are commanded to select individual output ports 127a-127n with their respective output antenna feeds where phase shifter 109cp values are selected to send a predetermined fraction of energy from the communication signal S1 to the respective output ports 127a-127n. The fractions of energy sent to the output ports 127a-127n by the phase shifter(s) 109cp feed different antennas to form individual fractionated communication signals s1a, s1b, s1c, s1d. The energy of at least two of the fractionated communication signals recombine in the far field to form a combined antenna pattern S1'. In one aspect the combined antenna pattern or beam S1' is adjusted by commanded the phase shifter(s) 109cp to conform to multiple predetermined patterns at TDMA rates. In one aspect the combined antenna beams S1' has variable beamwidths that peak up (e.g. point in a different direction than an uncombined or fractionated signal from a single antenna) at new directions not available when using the single output ports of the matrix power amplifier 109 in effect pointing the communication signal in a direction the antennas are not pointed in. In one aspect, the phase shift values for the phase shifters 109cp of the trim adjusters 109c described herein are computed on board the communication platform, such as the satellite communication system 100, 100A, by the controller 112 and/or the drive circuit 109p according to a predetermined algorithm. In one aspect the phase shift values are uploaded from the terrestrial (or other ground-based) source 199 in a manner substantially similar to the control signal 198 and are stored in memory 112A and recalled by, for example, the controller 112 as needed or used in real time.

In one aspect, referring to FIG. 4 the LNA redundancy rings 104A and the high speed switches 105 of the uplink receiver module 101 are replaced with matrix power amplifier or receive matrix 400. The receive matrix 400 is substantially similar to the matrix power amplifier 109 however, in this aspect the receive matrix 400 reshapes incoming communication signals rather than outgoing communication signals and the high power amplifiers are replaced with low noise amplifiers (LNAs) 409d. For example, signal S1 is transmitted to the satellite communications system 100 as a combined antenna beam. The combined antenna beam S1 is composed of fractionated communication signals that split to form two or more individual antenna beams S1a, S1b, S1c, S1d which are received by antennas connected to the inputs 426a-426n of the input hybrid matrix 409a. The trim adjusters 409c are commanded to select individual output ports 427a-427n of the output hybrid matrix 409b where phase shifter 409cp values are selected to send a predetermined fraction of energy from the communication signal S1 to the respective output ports 427a-427n where the communication signal formed by antenna beams S1a, S1b, S1c, S1d is reshaped by combining or splitting the fractions of energy to form communication signal S". In one aspect the fractions of energy sent to the output ports 427a-427n by the phase shifter(s) 409cp feed different inputs 116 of the channelizer 111 (FIGS. 1 and 2) so that the fractions of energy are transmitted through the channelizer 111 to a predetermined matrix power amplifier 109 of the downlink transmitter module 102. In a manner similar to that described herein, the commandable phase shifters 409cp of the trim adjusters 409c, under the control of the driver circuit 409p, select the communication signal (e.g. beam) routing within the matrix power amplifier 409, e.g. re-map each input 426a-426n to a predetermined output 427a-427n, by changing the phase progression angles between the LNAs 409d, which changes the output port 427a-427n to which the communication signals are routed. In one aspect, the bank of trim adjusters 409c align the responses of the bank of LNAs 409d such that the signals from one or more LNAs 409d combine in the output hybrid matrix 409b and sum to a single output 427a-427n of the matrix power amplifier 409. In one aspect, where only one signal is present on a single input then there exists a set of phase adjustments that will route the signal to any one or more of the outputs 427a-427n of the matrix power amplifier 409. In one aspect, the phase changes made by the trim adjusters 409c are made at TDMA rates for re-routing the communication signals through the matrix power amplifier while substantially eliminating high power switching and allowing the LNAs 409d to operate substantially simultaneously at maximum efficiency Referring now to FIGS. 5-5A, a portion of a satellite communications system 100D is shown. In one aspect of the present disclosure, multiple outputs 117a, 117b of the channelizer 111 are combined to form beams of wider bandwidths or multiple bands. In one aspect, the channelizer outputs 117a, 117b are connected to frequency converters 501, 502. The frequency converters 501, 502 receive the TDMA signals 130, 131 from the channelizer outputs 117a, 117b and output the respective TDMA signals 130, 131 to a duplexer/combiner 503. In one aspect, the frequency converters 501, 502 shift the TDMA signal 130, 131 to different frequencies. The frequency converters 501, 502, in combination with the duplexer/combiner 503, multiplex the TDMA signals 130, 131 from the channelizer outputs 117a, 117b with receive respective local oscillator frequencies L01, L02 into adjacent RF bands, forming beams of wider bandwidth, multiple bands or combined band 132 (see FIG. 5A). The combined band 132 from the duplexer/combiner 503 is output to the predetermined matrix power amplifier input 126 of the matrix power amplifier 109. In one aspect, the matrix power amplifier 127 outputs to the respective beam antennas $110A_{1-P}$ and $110B_{1-P}$ (see also FIG. 2) through a respective matrix power amplifier output 127. In the aspect shown in FIG. 5, two channelizer outputs 117a, 117b are combined by the duplexer/combiner 503. However, in other aspects, any predetermined number of channelizer outputs 117 can be combined by the duplexer/combiner 503.

Referring now to FIGS. 6 and 6A, in yet another aspect of the present disclosure is shown. In one aspect, the channelizer 111, hybrid MPA input matrix 109a and at least trim adjusters 109c, phase shifters 109cp and driver circuit 109p are integrated into a digital module 901. In other aspects, any of the low noise amplifiers 104, frequency converters 106, 107, TDMA switches 105, channelizer 111, matrix power amplifiers 109, satellite controller 112 or any portion thereof can be combined and implemented as part of a digital module of a digital signal processing computer. In the portion of the exemplary satellite communication system 100E shown in FIG. 6, the digital module 901 includes the channelizer 111, the hybrid MPA input matrix 109a of matrix power amplifier 109, the bank of trim adjusters 109c (including the commandable phase shifters 109cp) and the drive circuit 109p. In portion of the exemplary satellite communication system 100F shown in FIG. 6A, the frequency converters 106, the TDMA switch 105, the channelizer 111, satellite controller 112, hybrid MPA input matrix 109a of the matrix power amplifier 109, the bank of trim adjusters 109c (including the commandable phase shifters 109cp) and the drive circuit 109p are implemented as a digital module 1000.

Referring now to FIGS. 1, 1B, 2 and 7, an exemplary flow diagram of an operation of the satellite communications system 100 is shown. At block 700, an input communication signal is received from at least one beam antenna of the satellite communication system 100. For example, in one aspect, the TDMA switches 105 receive the input TDMA signal from the beam antenna 103 with the switch inputs 122. In one aspect of the present disclosure, the TDMA switches 105 also receive the time synchronization signal from the time synchronization module 112B of the satellite controller 112. The time synchronization signal determines how the TDMA signals received by the TDMA switches 105 are switched to the switch outputs 123 of the TDMA switch 105. At block 701, the TDMA switch 105 transmits input TDMA signal to the channelizer 111. In one aspect, the channelizer 111 provides frequency division multiplexing for the input TDMA signal received by the channelizer 111 from the TDMA switch 105 and generates an output TDMA signal according to the control signal from the satellite controller 112. At block 702, the channelizer 111 transmits the output TDMA signal to the input hybrid matrix 109a of the matrix power amplifier 109 (e.g. the output communication signal is received from the channelizer 111 with the input hybrid matrix 109a). At block 703, the output communication signal is selectively routed/re-routed to a predetermined output of the output hybrid matrix 109b of the matrix power amplifier in the manner described above by changing the phase of the output communication signal.

The disclosure and drawing figures describing the operations of the method(s) set forth herein should not be interpreted as necessarily determining a sequence in which the operations are to be performed. Rather, although one illustrative order is indicated, it is to be understood that the sequence of the operations may be modified when appropriate. Accordingly, certain operations may be performed in a different order or simultaneously. Additionally, in some aspects of the disclosure, not all operations described herein need be performed.

Examples of the disclosure may be described in the context of a spacecraft manufacturing and service method 800 as shown in FIG. 8 and a spacecraft 902 as shown in FIG. 9. During pre-production, illustrative method 800 may include specification and design 804 of the spacecraft 902 and material procurement 806. During production, component and subassembly manufacturing 808 and system integration 810 of the spacecraft 902 take place. Thereafter, the spacecraft 902 may go through certification and delivery 812 to be placed in service 814. While in service by a customer, the spacecraft 902 is scheduled for routine maintenance and service 816 (which may also include modification, reconfiguration, refurbishment, and so on).

Each of the processes of the illustrative method 800 may be performed or carried out by a system integrator, a third party, and/or an operator (e.g., a customer). For the purposes of this description, a system integrator may include, without limitation, any number of spacecraft manufacturers and major-system subcontractors; a third party may include, without limitation, any number of vendors, subcontractors, and suppliers; and an operator may be an airline, leasing company, military entity, service organization, and so on.

As shown in FIG. 9, the spacecraft 902 produced by the illustrative method 800 may include an airframe 918 with a plurality of high-level systems and an interior 922. Examples of high-level systems, which are distributed throughout the spacecraft, include one or more of a propulsion system 924, an electrical power system 926, a hydraulic system 928, and an environmental system 930 and the satellite communications relay system 931. Any number of other systems may be included. Although an aerospace example is shown, the principles of the invention may be applied to other industries, such as the maritime industries.

The system and methods shown or described herein may be employed during any one or more of the stages of the manufacturing and service method 800. For example, components or subassemblies corresponding to component and subassembly manufacturing 808 may be fabricated or manufactured in a manner similar to components or subassemblies produced while the spacecraft 902 is in service. Also, one or more aspects of the system, method, or combination thereof may be utilized during the production states 808 and 810, for example, by substantially expediting assembly of or reducing the cost of a spacecraft 902. Similarly, one or more aspects of the system or method realizations, or a combination thereof, may be utilized, for example and without limitation, while the spacecraft 902 is in service, e.g., operation, maintenance and service 816.

Different examples and aspects of the system and methods are disclosed herein that include a variety of components, features, and functionality. It should be understood that the various examples and aspects of the system and methods disclosed herein may include any of the components, features, and functionality of any of the other examples and aspects of the system and methods disclosed herein in any combination, and all of such possibilities are intended to be within the spirit and scope of the present disclosure.

Many modifications and other examples of the disclosure set forth herein will come to mind to one skilled in the art to which the disclosure pertains having the benefit of the teachings presented in the foregoing descriptions and the associated drawings.

As described herein, the aspects of the disclosed embodiment reduce the complexity and cost of the high power section of, for example, a satellite communication system 100 while maximizing the flexibility of routing the available RF power to the ever increasing number of antenna beams 110 with varying capacity demands. The aspects of the disclosed embodiment provide for larger capacity, efficient bandwidth utilization, weight reduction, reduction in power consumption and flexibility in beam allocation. The matrix power amplifier(s) 109, 409 described herein replace complex microwave input and output multiplexers filter networks required for digital switching. The aspects of the disclosed embodiment also simplify high throughput satellite payloads and increases through capacity which in turn lowers cost and build time of the satellite and minimizes cost per bit and end user cost.

In accordance with one or more aspects of the present disclosure, a communication system includes: a communication platform; and a downlink communication module connected to the communication platform and having a matrix power amplifier, the matrix power amplifier including an input hybrid matrix, an output hybrid matrix, a bank of high power amplifiers disposed between and in communication with at least the input hybrid matrix and the output hybrid matrix, and a bank of adjusters disposed between and in communication with at least the input hybrid matrix and the output hybrid matrix; and a driver circuit connected to each adjuster in the bank of adjusters, the driver circuit being configured to command each adjuster to modify communication signals, passing through the matrix power amplifier, at time division multiple access rates.

In accordance with one or more aspects of the present disclosure there is an adjuster corresponding to each high power amplifier.

In accordance with one or more aspects of the present disclosure the adjuster is disposed upstream from the corresponding high power amplifier.

In accordance with one or more aspects of the present disclosure the adjuster is disposed downstream from the corresponding high power amplifier.

In accordance with one or more aspects of the present disclosure the bank of adjusters is configured to align a response of the bank of high power amplifiers to combine communication signals, in a predetermined combination, in the output hybrid matrix, where the combined communication signals sum to a single output of the matrix power amplifier.

In accordance with one or more aspects of the present disclosure each adjuster is configured to change a phase of the communication signals in a re-mapping of each input of the input hybrid matrix to a predetermined output of the output hybrid matrix.

In accordance with one or more aspects of the present disclosure the communication system further includes at least one downlink antenna beam where each output of the output hybrid matrix is coupled to a respective downlink antenna beam.

In accordance with one or more aspects of the present disclosure the bank of adjusters is configured to cause a selectable remapping of at least one output of the output hybrid matrix with respect to at least one input of the input hybrid matrix at time divisional multiple access rates and free from high power output switching.

In accordance with one or more aspects of the present disclosure each high power amplifier of the bank of high power amplifiers operates simultaneously.

In accordance with one or more aspects of the present disclosure the communication signals are radio frequency signals or optical signals.

In accordance with one or more aspects of the present disclosure a matrix power amplifier includes: an input hybrid matrix having more than one input; an output hybrid matrix having more than one output; a bank of high power amplifiers disposed between and in communication with at least the input hybrid matrix and the output hybrid matrix;

a bank of adjusters disposed between and in communication with at least the input hybrid matrix and the output hybrid matrix; and a driver circuit connected to each adjuster in the bank of adjusters, the driver circuit being configured to command each adjuster to modify communication signals, passing through the matrix power amplifier, at time division multiple access rates.

In accordance with one or more aspects of the present disclosure there is an adjuster corresponding to each high power amplifier.

In accordance with one or more aspects of the present disclosure the adjuster is disposed upstream from the corresponding high power amplifier.

In accordance with one or more aspects of the present disclosure the adjuster is disposed downstream from the corresponding high power amplifier.

In accordance with one or more aspects of the present disclosure the bank of adjusters is configured to align a response of the bank of high power amplifiers to combine communication signals, in a predetermined combination, in the output hybrid matrix, where the combined communication signals sum to a single output of the matrix power amplifier.

In accordance with one or more aspects of the present disclosure each adjuster is configured to change a phase of the communication signals in a re-mapping of each input of the input hybrid matrix to a predetermined output of the output hybrid matrix.

In accordance with one or more aspects of the present disclosure the bank of adjusters is configured to cause a selectable remapping of at least one output of the output hybrid matrix with respect to at least one input of the input hybrid matrix at time divisional multiple access rates and free from high power output switching.

In accordance with one or more aspects of the present disclosure each high power amplifier of the bank of high power amplifiers operates simultaneously.

In accordance with one or more aspects of the present disclosure the communication signals are radio frequency signals or optical signals.

In accordance with one or more aspects of the present disclosure a method of communication includes: inputting a communication signal to an input hybrid matrix of a matrix power amplifier; and selectively re-routing the communication signal to a predetermined output of an output hybrid matrix of the matrix power amplifier by modifying the communication signal at time division multiple access rates.

In accordance with one or more aspects of the present disclosure the communication signals are radio frequency signals or optical signals.

In accordance with one or more aspects of the present disclosure the communication signal is modified prior to the communication signal entering a high power amplifier of the matrix power amplifier.

In accordance with one or more aspects of the present disclosure modifying the communication signal includes changing a phase progression angle of the communication signal.

In accordance with one or more aspects of the present disclosure the method further includes forming a combined antenna pattern by phase shifting the communication signal to send predetermined fractions of energy to a predetermined number of output ports of the matrix power amplifier to feed different beam antennas, where the predetermined fractions of energy recombine to form the combined antenna pattern.

In accordance with one or more aspects of the present disclosure the modification of the communication signal is a digital modification.

Therefore, it is to be understood that the disclosure is not to be limited to the specific embodiments disclosed and that modifications and other embodiments are intended to be included within the scope of the appended claims. Moreover, although the foregoing descriptions and the associated drawings describe example embodiments in the context of certain illustrative combinations of elements and/or functions, it should be appreciated that different combinations of elements and/or functions may be provided by alternative implementations without departing from the scope of the appended claims.

What is claimed is:

1. A communication system comprising:
a communication platform;
a downlink communication module connected to the communication platform and having a matrix power amplifier, the matrix power amplifier including
an input hybrid matrix,
an output hybrid matrix,
a bank of high power amplifiers disposed between and in communication with at least the input hybrid matrix and the output hybrid matrix, and
a bank of adjusters disposed between and in communication with at least the input hybrid matrix and the output hybrid matrix; and
a driver circuit connected to each adjuster in the bank of adjusters, the driver circuit being configured to command each adjuster to modify communication signals, passing through the matrix power amplifier, at time division multiple access rates so that outputs of the bank of high power amplifiers are re-routed at the time division multiple access rates between predetermined antenna beams based on a modification to a communication signal.

2. The communication system of claim 1, wherein there is an adjuster corresponding to each high power amplifier.

3. The communication system of claim 2, wherein the adjuster is disposed upstream from the corresponding high power amplifier.

4. The communication system of claim 1, wherein the bank of adjusters is configured to align a response of the bank of high power amplifiers to combine communication signals, in a predetermined combination, in the output hybrid matrix, where the combined communication signals sum to a single output of the matrix power amplifier.

5. The communication system of claim 1, wherein each adjuster is configured to change a phase of the communication signals in a re-mapping of each input of the input hybrid matrix to a predetermined output of the output hybrid matrix.

6. The communication system of claim 1, further comprising at least one downlink antenna beam where each output of the output hybrid matrix is coupled to a respective downlink antenna beam.

7. The communication system of claim 1, wherein the bank of adjusters is configured to cause a selectable remapping of at least one output of the output hybrid matrix with respect to at least one input of the input hybrid matrix at time divisional multiple access rates and free from high power output switching.

8. The communication system of claim 7, wherein each high power amplifier of the bank of high power amplifiers operates simultaneously.

9. The communication system of claim 1, wherein the communication signals are radio frequency signals or optical signals.

10. A matrix power amplifier comprising:
an input hybrid matrix having more than one input;
an output hybrid matrix having more than one output;
a bank of high power amplifiers disposed between and in communication with at least the input hybrid matrix and the output hybrid matrix;
a bank of adjusters disposed between and in communication with at least the input hybrid matrix and the output hybrid matrix; and
a driver circuit connected to each adjuster in the bank of adjusters, the driver circuit being configured to command each adjuster to modify communication signals, passing through the matrix power amplifier, at time division multiple access rates so that outputs of the bank of high power amplifiers are re-routed at the time division multiple access rates between predetermined antenna beams based on a modification to a communication signal.

11. The matrix power amplifier of claim 10, wherein there is an adjuster corresponding to each high power amplifier.

12. The matrix power amplifier of claim 11, wherein the adjuster is disposed upstream from the corresponding high power amplifier.

13. The matrix power amplifier of claim 10, wherein the bank of adjusters is configured to align a response of the bank of high power amplifiers to combine communication signals, in a predetermined combination, in the output hybrid matrix, where the combined communication signals sum to a single output of the matrix power amplifier.

14. The matrix power amplifier of claim 10, wherein each adjuster is configured to change a phase of the communication signals in a re-mapping of each input of the input hybrid matrix to a predetermined output of the output hybrid matrix.

15. The matrix power amplifier of claim 10, wherein the bank of adjusters is configured to cause a selectable remapping of at least one output of the output hybrid matrix with respect to at least one input of the input hybrid matrix at time divisional multiple access rates and free from high power output switching.

16. A method of communication comprising:
inputting a communication signal to an input hybrid matrix of a matrix power amplifier; and
selectively re-routing, at time division multiple access rates, the communication signal to a predetermined output of an output hybrid matrix of the matrix power amplifier by modifying the communication signal at the time division multiple access rates.

17. The method of claim 16, wherein the communication signal is modified prior to the communication signal entering a high power amplifier of the matrix power amplifier.

18. The method of claim 16, wherein modifying the communication signal includes changing a phase progression angle of the communication signal.

19. The method of claim 16, further comprising forming a combined antenna pattern by phase shifting the communication signal to send predetermined fractions of energy to a predetermined number of output ports of the matrix power amplifier to feed different beam antennas, where the predetermined fractions of energy recombine to form the combined antenna pattern.

20. The method of claim 16, wherein the modification of the communication signal is a digital modification.

* * * * *